(12) United States Patent
Yancey

(10) Patent No.: US 7,764,509 B2
(45) Date of Patent: Jul. 27, 2010

(54) METHOD AND APPARATUS FOR INTERFACING COMPONENTS

(75) Inventor: Jerry William Yancey, Rockwall, TX (US)

(73) Assignee: Spirit AeroSystems, Inc., Wichita, KS (US)

( * ) Notice: Subject to any disclaimer, the term of this patent is extended or adjusted under 35 U.S.C. 154(b) by 670 days.

(21) Appl. No.: 11/613,378

(22) Filed: Dec. 20, 2006

(65) Prior Publication Data
US 2008/0151514 A1    Jun. 26, 2008

(51) Int. Cl.
*H05K 1/16* (2006.01)
(52) U.S. Cl. ........................ 361/766; 174/260
(58) Field of Classification Search ................ 361/766, 361/803, 810, 748; 174/263, 262, 250; 29/843
See application file for complete search history.

(56) References Cited

U.S. PATENT DOCUMENTS

| | | | |
|---|---|---|---|
| 6,983,385 B2 * | 1/2006 | German et al. | 713/300 |
| 7,097,040 B1 * | 8/2006 | Gutentag | 206/714 |
| 2004/0238205 A1 * | 12/2004 | Miller et al. | 174/250 |
| 2005/0286189 A1 * | 12/2005 | Rhodes | 361/62 |
| 2008/0043448 A1 * | 2/2008 | Finnerty et al. | 361/748 |
| 2008/0288709 A1 * | 11/2008 | Stanley-Jones et al. | 710/313 |

OTHER PUBLICATIONS

Zero ohm resistors cropped; Wikipedia, the free encyclopedia; Dec. 7, 2006.

\* cited by examiner

*Primary Examiner*—Jeremy C Norris
*Assistant Examiner*—Yuriy Semenenko
(74) *Attorney, Agent, or Firm*—Hovey Williams LLP

(57) ABSTRACT

An apparatus operable to interface an electronic component with a signal input. The apparatus may generally include a low-ohm resistor and a voltage translator coupled with the low-ohm resistor. The low-ohm resistor is operable to couple with the input to receive an input signal therefrom. The voltage translator is operable to couple with the electronic component and translate the input signal from a first voltage to a second voltage for use by the electronic component. The low-ohm resistor and voltage translator may be positioned by a pick and place assembly machine such that embodiments of the present invention do not require a technician to manually couple and solder the apparatus to the input and electronic component.

11 Claims, 3 Drawing Sheets

METHOD AND APPARATUS FOR INTERFACING COMPONENTS

BACKGROUND OF THE INVENTION

1. Field of the Invention

Embodiments of the present invention relate to methods and apparatuses for interfacing electronic components with signal inputs. More particularly, various embodiments of the invention enable electronic components to be easily and correctly interfaced with signal inputs by utilizing voltage translators and low-ohm resistors.

2. Description of the Related Art

It is often desirable to interface components on printed circuit boards to form electronic devices and systems. Engineers commonly utilize standardized boards, signal inputs, connections, buses, form factors, sockets, and other off-the-shelf equipment when designing systems. However, system components, such as integrated circuits, may require particular voltage levels that are not provided by standardized inputs. In situations where voltage levels provided by standardized inputs are not suitable for use by particular system components, voltage translators may be used to translate input voltages to appropriate voltages. Unfortunately, prior art assembly methods and systems provide fixed configurations which are difficult to modify when similar, but different arrangements of inputs, voltage translators, and other components are required. Thus, it is often difficult for a single printed-circuit card layout to interface particular system components with standardized inputs in multiple configurations.

SUMMARY OF THE INVENTION

Embodiments of the present invention solve the above-described problems and provide a distinct advance in the art of interfacing electronic components. More particularly, embodiments of the invention enable electronic components to be easily and correctly interfaced with signal inputs by utilizing voltage translators and low-ohm resistors.

For example, various embodiments of the present invention provide an apparatus operable to interface an electronic component with a signal input. The apparatus may generally include a low-ohm resistor and a voltage translator coupled with the low-ohm resistor. The low-ohm resistor is operable to couple with the input to receive an input signal therefrom. The voltage translator is operable to couple with the electronic component and translate the input signal from a first voltage to a second voltage for use by the electronic component. The low-ohm resistor and voltage translator may be positioned by a pick and place assembly machine such that embodiments of the present invention do not require a technician to manually couple and solder the apparatus to the input and electronic component. The apparatus may also include additional low-ohm resistors and voltage translators to interface any number of electronic components and inputs.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein.

Figure 1:
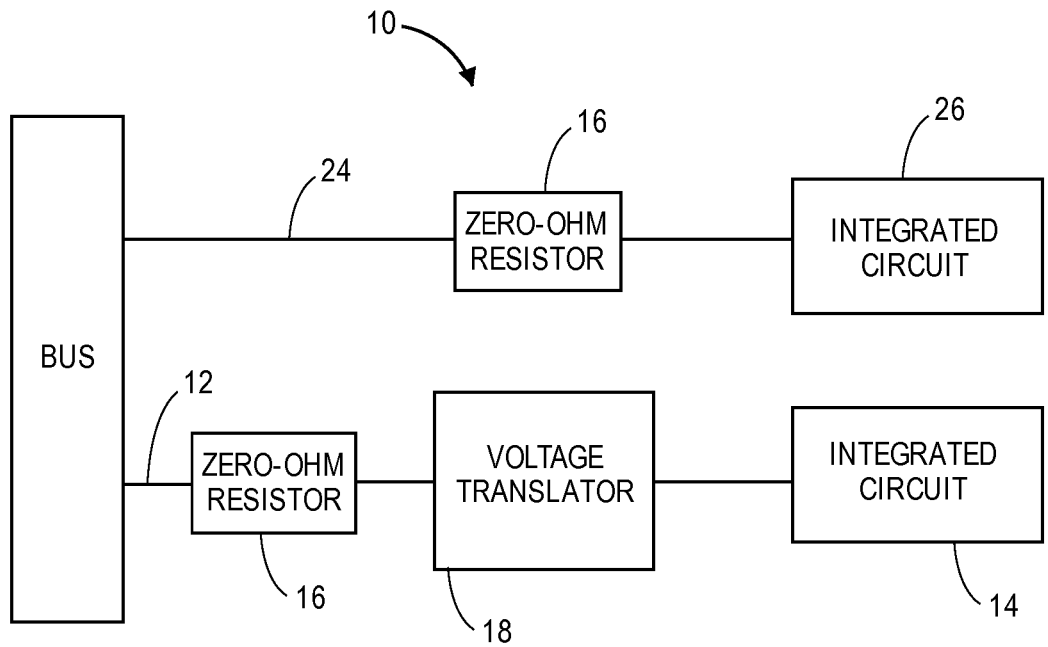
FIG. 1 is a block diagram of an interface including low-ohm resistors and voltage translators configured in accordance with various preferred embodiments of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Referring to FIGS. 1-7, embodiments of the present invention provide a component interface 10 operable to correctly interface electronic components such a first signal input 12 and a first electronic component 14. In some embodiments, the interface 10 is operable to interface a plurality of signal inputs and a plurality of electronic components, as is discussed in more detail below.

The interface 10 generally includes a low-ohm resistor 16 coupled with a voltage translator 18. The low-ohm resistor 16 is operable to couple with the first signal input 12 to receive a first input signal therefrom. The voltage translator 18 is generally operable to couple with the first electronic component 14 and translate the first input signal from a first voltage to a second voltage for use by the first electronic component 14.

Figure 6:
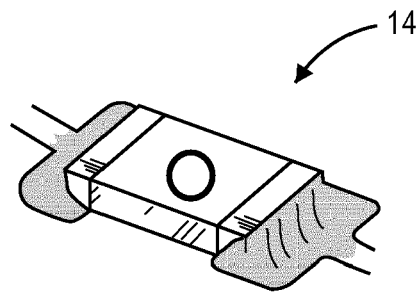
FIG. 6 is a perspective view of a surface-mount low-ohm resistor operable to be utilized by various embodiments of the present invention.
Figure 7:
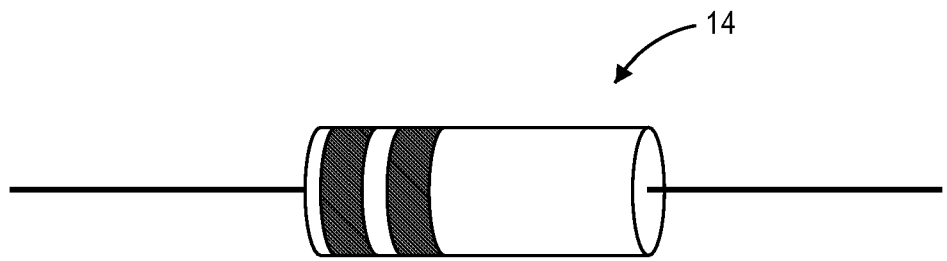
FIG. 7 is a perspective view of a through-hole axial low-ohm resistor operable to be utilized by various embodiments of the present invention.

The low-ohm resistor 16 may be packaged in a standardized resistor configuration to facilitate assembly and placement of the interface 10. Thus, in various embodiments the low-ohm resistor 16 may be configured as a surface-mount resistor, as shown in FIG. 6, or as a through-hole axial resistor, as shown in FIG. 7. However, the low-ohm resistor 16 may be packaged in any configuration operable to be placed by conventional pick and place assembly machines, including surface-mount resistor networks, through-hole SIPP (single inline pin package) and DIP (dual inline package) configurations, combinations thereof, and the like.

In various embodiments, the low-ohm resistor 16 is a zero-ohm resistor having a resistance consistent with that of a wire or circuit trace. However, in other embodiments the low-ohm resistor 16 may have a resistance substantially greater or less than the typical resistance of a wire or circuit trace such that zero-ohm resistors are not necessarily employed by the interface 10. Thus, the low-ohm resistor 16 may have any resistance that does not substantially impede functionality of the voltage translator 18 or first electronic component 14. The low-ohm resistor 16 preferably has a resistance less than approximately one ohm and more preferably has a resistance less than approximately 0.1 ohm.

The voltage translator 18 may be any element or combination of elements operable to translate between at least two voltages, such as the first and second voltages discussed above. The voltage translator 18 may include digital components, analog components, microprocessors, microcontrollers, digital logic elements, programmable logic devices, digital signal processing elements, combinations thereof, and the like. In some embodiments, the voltage translator 18 may additionally or alternatively be operable to translate currents for proper use by electronic components.

The voltage translator 18 may be packaged in a configuration operable to be placed by pick and place assembly machines in a similar manner to the low-ohm resistor 16 discussed above. In some embodiments, the voltage translator 18 may be packaged in a surface-mount configuration. However, the voltage translator 18 may alternatively be packaged in through-hole configurations, such as dual in-line package (DIP) or shrink dual in-line package (SDIP) formats.

Figure 2:
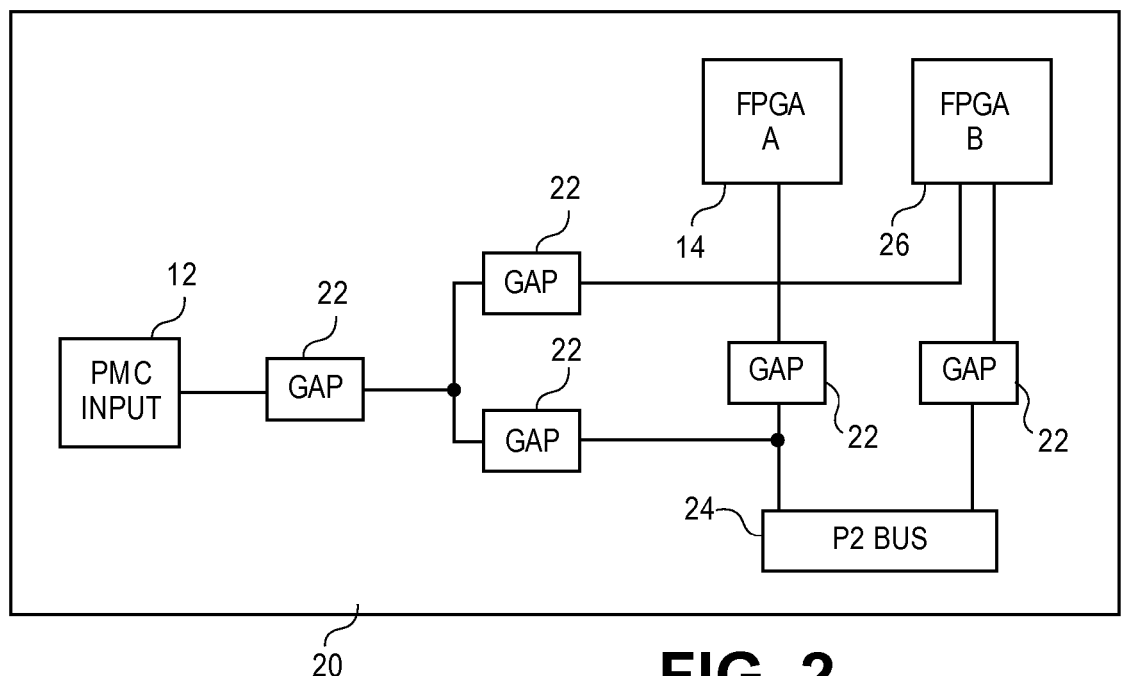
FIG. 2 is a block diagram of a printed circuit board including a plurality of gaps.

In various embodiments, and as shown in FIG. 2, the first signal input 12 and first electronic component 14 may be mounted on a printed circuit board (PCB) 20 having a plurality of gaps 22 positioned thereon. Within each gap 22, the low-ohm resistor 16 or voltage translator 18 may be positioned to form any desired interface between the first signal input 12 and first electronic component 14.

Thus, for example, a manufacturer may distribute the PCB 20 with the first signal input 12 and gaps 22 positioned thereon to enable users to mount any electronic components, such as the first electronic component 14, to the PCB 20 and correctly interface the electronic components with the first signal input 12 utilizing the interface 10. Thus, copies of the PCB 20 including the first signal input 12, or other inputs, may be distributed to a plurality of users, with each user being able to form a unique system by utilizing the interface 10.

Additionally, the packaging of the low-ohm resistor 16 and voltage translator 18 enables the interface 10 to be positioned on the PCB 20 utilizing automated devices and methods, such as conventional pick and place assembly machines. Thus, the interface 10 need not be manually soldered to the PCB 20, the first signal input 12, and the first electronic component 14 by a technician as the low-ohm resistor 16 and voltage translator 18 may be easily and automatically positioned within the gaps 22 by one or more pick and place assembly machines.

The interface 10 may be configured to interface any number of inputs with any number of electronic components by utilizing combinations of low-ohm resistors 16 and voltage translators 18. In some embodiments, as shown in FIGS. 1-5, the interface 10 is operable to interface the first signal input 12, the first electronic component 14, a second signal input 24, and a second electronic component 26. By utilizing the gaps 22 formed in the PCB 20, the inputs 12, 24 and components 14, 26 may be interfaced in any configuration by positioning low-ohm resistors 16 and/or voltage translators 18 in selected or particular gaps 22.

Figure 3:
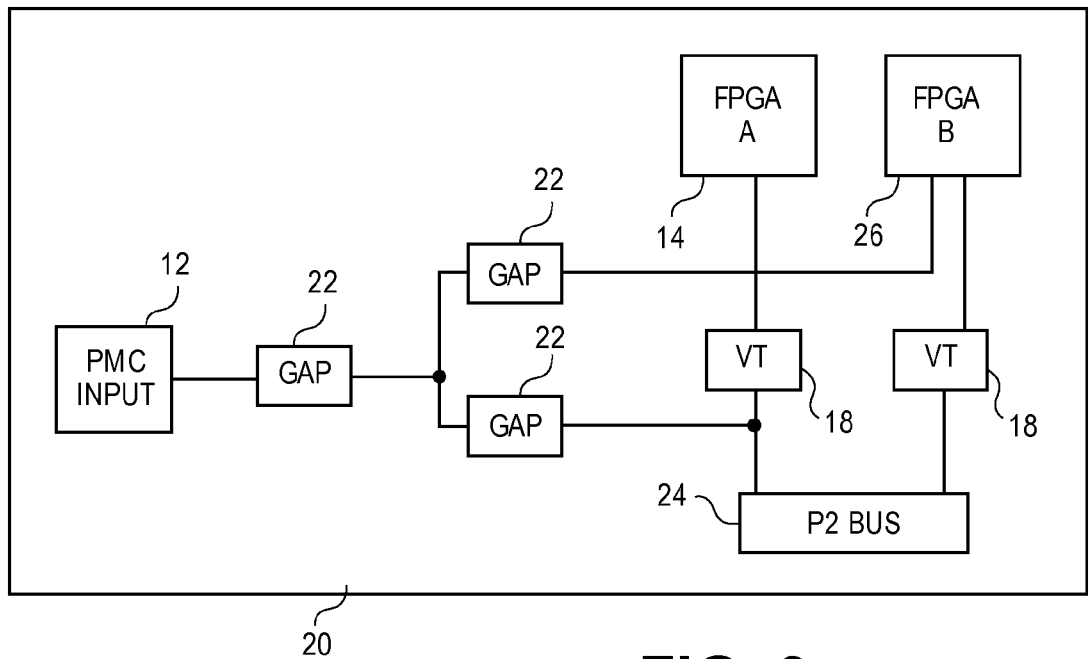
FIG. 3 is a block diagram of another interface provided by various embodiments of the present invention.
Figure 4:
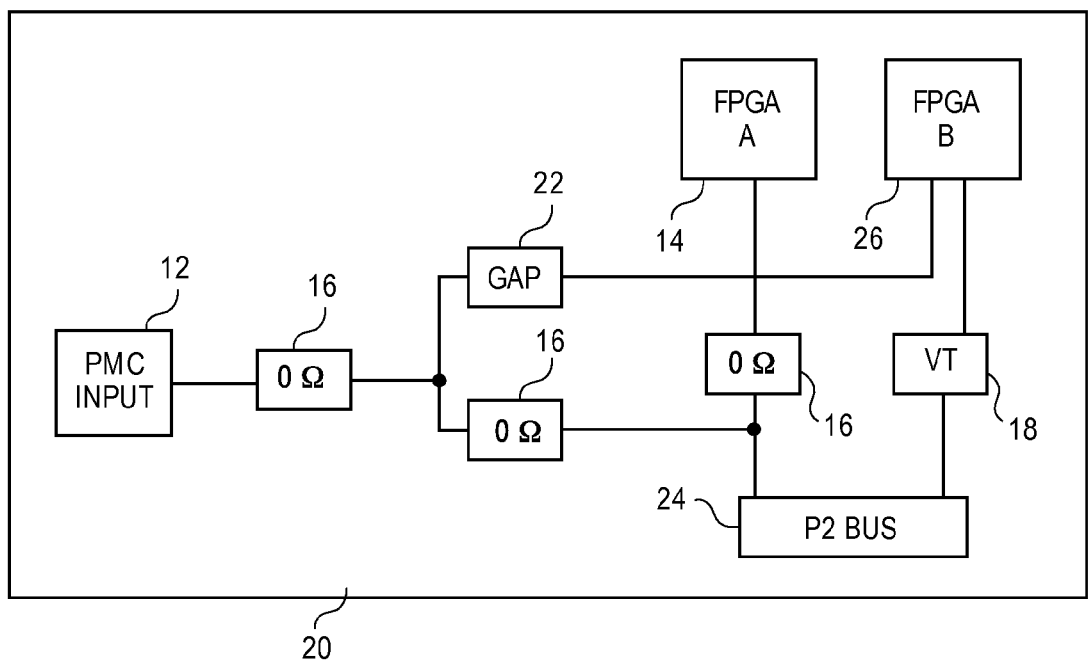
FIG. 4 is a block diagram of another interface provided by various embodiments of the present invention.
Figure 5:
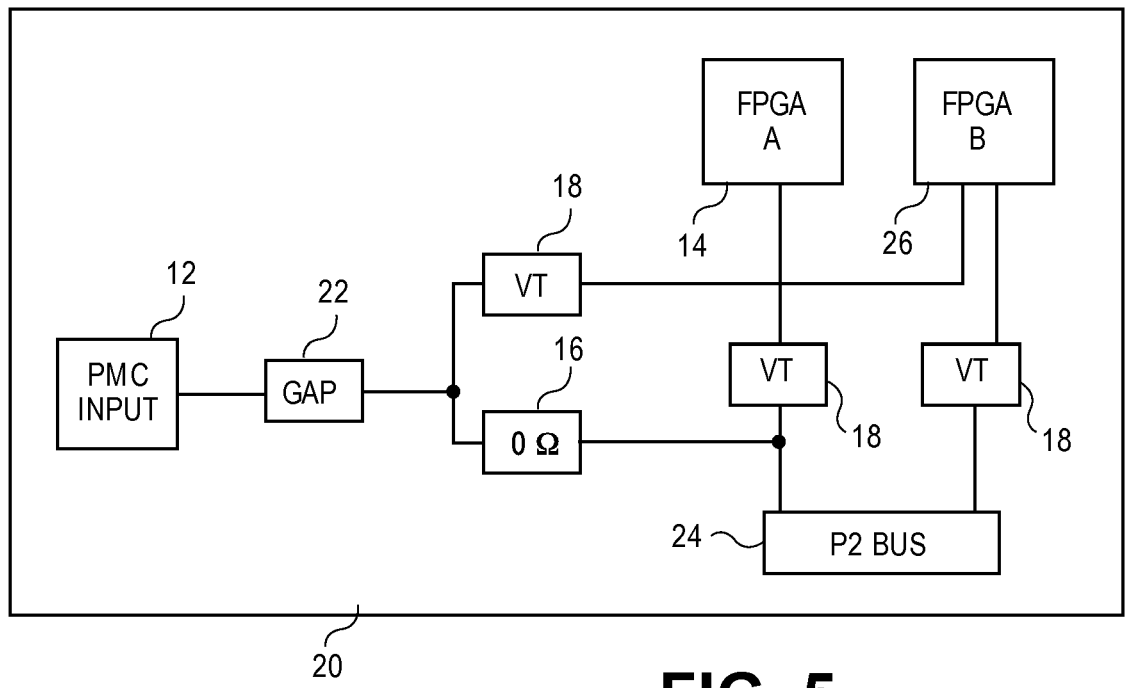
FIG. 5 is a block diagram of another interface provided by various embodiments of the present invention.

As shown the examples provided by FIGS. 3-5, the components 14, 26 may be selectively coupled with any combination of the inputs 12, 24 by placing low-ohm resistors 16 and/or voltage translators 18 within the various gaps 22 formed on the PCB 20. In particular, the examples of FIGS. 3-5 each provide an IEEE P1386.1 PCI mezzanine card (PMC) input as the first signal input 12, a RACE++ P2 bus as the second signal input 24, a first field-programmable gate array (FPGA) as the first electronic component 14, and a second FPGA as the second electronic component 26.

However, as should be appreciated, the interface 10 may couple any type of inputs and electronic components and is not limited to the PMC and RACE++ P2 inputs illustrated in FIGS. 2-5. For example, the interface 10 may couple inputs including single pins, buses, connectors, cables, sockets, jacks, combinations thereof, and the like with electronic components such as integrated circuits, microprocessors, programmable logic devices, discrete analog and digital components, etc.

As shown in the example of FIG. 3, the components 14, 26 may each be coupled with the second signal input 24 by placing voltage translators 18 in the gaps 22 formed on the PCB 20 between the second signal input 24 and the components 14, 26.

As shown in the example of FIG. 4, the first electronic component 14 may be coupled with the first signal input 12 utilizing a plurality of low-ohm resistors 16 positioned in the gaps 22 formed on the PCB 20 between the first signal input 12 and the first electronic component 14. The second electronic component 26 may be coupled with the second signal input 24 by positioning a voltage translator 18 within the gap 22 formed on the PCB 20 between the second signal input 24 and second electronic component 26. Thus, in some embodiments the components 14, 26 may be interfaced with the inputs 12, 24 without requiring the use of both a low-ohm resistor and voltage translator.

As shown in the example of FIG. 5, the first electronic component 14 may be coupled with the second signal input 24 utilizing a voltage translator 18 and the second electronic component 26 may be coupled with the second signal input 24 at two locations utilizing a plurality of voltage translators 18 and low-ohm resistors 16. Thus, by placing voltage translators 18 and low-ohm resistors 16 within the gaps 22 formed on the PCB 20, any interface configuration may be formed between any number of inputs and electrical components, including interfacing a single electronic component with a plurality of inputs provided by a single bus.

In some embodiments, low-ohm resistors 16 may be coupled to opposite ends of a high-performance bus, such as one of the inputs 12, 24, to prevent the stubbing of other connections and performance reductions. Thus, the low-ohm resistors 16 are not necessarily positioned on only one end of the inputs 12,24.

Utilization of the interface 10 to couple inputs and electronic components enables sensitive integrated circuit components, such as certain FPGA I/O pins, to be isolated from high input voltages by voltage translators 18 while allowing less-sensitive integrated circuit components to be mapped to standard pins utilizing low-ohm resistors 16.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

The invention claimed is:

1. An apparatus for interfacing electronic components with signal inputs, the apparatus comprising:

a first low-ohm resistor configured to couple with a first input to receive a first input signal;

a first voltage translator coupled to and packaged with the first low-ohm resistor and configured to couple with a first electronic component and translate the first input signal from a first voltage to a second voltage for use by the first electronic component; and a second low-ohm resistor packaged with the first low-ohm resistor and the first voltage translator and configured to couple with the first input and a second electronic component and provide the first input signal to the second electronic component.

2. The apparatus of claim 1, further including a third low-ohm resistor and a second voltage translator coupled thereto, the third low-ohm resistor operable to couple with a second signal input to receive a second input signal therefrom and the second voltage translator operable to couple with the second electronic component and translate the second input signal from a third voltage to a fourth voltage.

3. The apparatus of claim 1, wherein the first electronic component, second electronic component, and first signal input are positioned on a printed circuit board and the apparatus is configured to be placed within gaps formed on the printed circuit board.

4. The apparatus of claim 3, wherein the apparatus is configured to be positioned within the gaps by a pick and place assembly machine.

5. The apparatus of claim 1, wherein the first low-ohm resistor is a surface-mount resistor.

6. The apparatus of claim 1, wherein the first low-ohm resistor is a through-hole axial resistor.

7. The apparatus of claim 1, wherein the first low-ohm resistor is a zero-ohm resistor.

8. An apparatus for interfacing electronic components with signal inputs, the apparatus comprising:

a plurality of low-ohm resistors configured to couple with a first signal input to receive a first input signal; and at least one voltage translator coupled to and packaged with at least one of the low-ohm resistors and configured to couple with a first electronic component and translate the first signal input signal from a first voltage to a second voltage for use by the first electronic component, wherein at least one of the low-ohm resistors is configured to couple with the first signal input and a second electronic component and provide the first input signal to the second electronic component, wherein the apparatus is operable to interface one or more signal inputs with a plurality of electronic components having varying voltage input requirements.

9. The apparatus of claim 8, wherein the first electronic component is a sensitive integrated circuit requiring isolation from high input voltage provided by the first input signal, wherein said isolation is provided by the at least one voltage translator, and wherein the second electronic component is less sensitive to high voltages than the first electronic component and is operable to receive the high input voltage provided by the first input signal.

10. An apparatus for interfacing electronic components with signal inputs, the apparatus comprising:

a first low-ohm resistor configured to couple with a first signal input to receive a first input signal;

a first voltage translator coupled to and packaged with the first low-ohm resistor and configured to couple with a first electronic component and translate the first input signal from a first voltage to a second voltage for use by the first electronic component;

a second low-ohm resistor packaged with the first low-ohm resistor and the first voltage translator and configured to couple with the first signal input and a second electronic component and provide the first input signal to the second electronic component;

a third low-ohm resistor configured to couple with a second signal input to receive a second input signal therefrom; and a second voltage translator coupled to the third low-ohm resistor configured to couple with the second electronic component and translate the second input signal from a third voltage to a fourth voltage, wherein the apparatus is positioned on a printed circuit board and configured to be placed within gaps formed on the printed circuit board by a pick and place assembly machine, wherein the first, second, and third low-ohm resistors each have a resistance of less than one ohm.

11. The apparatus of claim 10, wherein at least one of the first signal input and the second signal input are at least one of an IEEE P1386.1 PCI mezzanine card and a RACE++ P2 bus, and wherein the first and second electronic components are field programmable gate arrays (FPGAs).

* * * * *

UNITED STATES PATENT AND TRADEMARK OFFICE
CERTIFICATE OF CORRECTION

| | |
|---|---|
| PATENT NO. | : 7,764,509 B2 |
| APPLICATION NO. | : 11/613378 |
| DATED | : July 27, 2010 |
| INVENTOR(S) | : Jerry William Yancey |

Page 1 of 1

It is certified that error appears in the above-identified patent and that said Letters Patent is hereby corrected as shown below:

On the Title page item [73] should read
--(73) Assignee: L3 Communications Integrated Systems, L.P., Greenville, TX (US)--.

Signed and Sealed this

Second Day of November, 2010

David J. Kappos
*Director of the United States Patent and Trademark Office*